United States Patent [19]
Thomas

[11] Patent Number: 5,828,126
[45] Date of Patent: Oct. 27, 1998

[54] CHIP ON BOARD PACKAGE WITH TOP AND BOTTOM TERMINALS

[75] Inventor: Stephen J. Thomas, San Jose, Calif.

[73] Assignee: VLSI Technology, Inc., San Jose, Calif.

[21] Appl. No.: 254,143

[22] Filed: Jun. 6, 1994

Related U.S. Application Data

[63] Continuation-in-part of Ser. No. 900,211, Jun. 17, 1992, abandoned.

[51] Int. Cl.$^6$ .......................... H01L 23/48; H01L 23/04; H01L 23/053; H05K 1/11
[52] U.S. Cl. ..................... 257/695; 257/698; 257/668; 257/690; 257/700; 361/792; 174/52.4
[58] Field of Search ..................... 257/698, 699, 257/668, 787, 690, 691, 700, 735, 736, 781, 692–697, 702, 703

[56] References Cited

U.S. PATENT DOCUMENTS

| | | | |
|---|---|---|---|
| 4,539,622 | 9/1985 | Akasaki | 361/401 |
| 5,103,292 | 4/1992 | Mahulikar | 257/697 |

FOREIGN PATENT DOCUMENTS

| | | | |
|---|---|---|---|
| 63-293962 | 11/1988 | Japan | 257/698 |
| 1059835 | 3/1989 | Japan | 257/787 |
| 1-162353 | 6/1989 | Japan | 257/688 |
| 3252155 | 11/1991 | Japan | 257/796 |
| 5095070 | 4/1993 | Japan | 257/669 |

OTHER PUBLICATIONS

"Electronic Packaging and Interconnecti0on Handbook", pp. 6.35–6.36, C. Harper.

*Primary Examiner*—Mahshid D. Saadat
*Assistant Examiner*—Jhihan B. Clark
*Attorney, Agent, or Firm*—Wagner, Murabito & Hao

[57] ABSTRACT

An integrated circuit package of this invention includes a series of nonconductive rigid substrates, each substrate having a pattern of generally coplanar bond fingers embedded thereupon. An integrated circuit die is connected to individual bond fingers of varying bond finger patterns. Individual bond fingers are connected to package terminals by medial leads, which are generally perpendicular to the bond finger patterns. Semiconductor die packages having both top and bottom package terminals are thus produced. Methods and devices are shown.

7 Claims, 5 Drawing Sheets

CHIP ON BOARD PACKAGE WITH TOP AND BOTTOM TERMINALS

REFERENCE TO RELATED APPLICATION

This is a continuation in part of an earlier, U.S. patent application Ser. No. 07/900,211, filed Jun. 17, 1992, abandoned, the disclosure of which is incorporated herein by reference in its entirety.

TECHNICAL FIELD

This invention relates to semiconductor devices, and especially to packages, and methods of making packages, for semiconductor devices.

BACKGROUND OF THE INVENTION

Advances in integrated circuit technology allow a single semiconductor die to perform functions that previously required multiple dies. As size parameters have decreased, semiconductor devices have gone through many iterations reducing the size of the semiconductor building block, the transistor. Paralleling the decrease in size of transistor dimension is the increase in the number of individual transistors that occupy a single semiconductor die.

To use the many integrated circuits on a semiconductor die, the semiconductor die must communicate with the environment in which the packaged chip is used. For example, a circuit board may contain one or more packaged integrated circuit chips and one or more discrete circuit elements which are connected electrically. Semiconductor devices communicate by accepting electrical impulses supplied by an external circuit (such as on a circuit board) connected to the chip, conducting these impulses to electrical circuits contained in the die, and reacting to those input impulses in a predetermined manner to generate electrical impulses that are then output from the chip to an external circuit (e.g., on the circuit board). The input and output of electrical impulses to the semiconductor device occur over electrically conducting material, commonly referred to as leads. As transistor density has increased in each generation of semiconductor devices, so has the need to increase the number of leads available for connection to and from the semiconductor device.

One method of providing a large number of leads from a single semiconductor die is embodied in a pin grid array (PGA) package type. In this type of package, an ordered series of pins extend from the base of the package surrounding the enclosed semiconductor die. The pins provide the necessary electrical connections. PGA packaging requires that a corresponding hole or recess having appropriate electrical connections be provided for each pin of the array. A large number of these electrical connections are made on the underside of the PGA package, making it difficult to visually determine that all connections have been properly made. Further, the requirements of physical and electrical separation of each pin and its receptor area mandate that the pins cannot be too close together. The larger the number of pins in a PGA package, the larger the package must be. For example, the body of a commonly used PGA package having 223 pins is a square measuring 1.860 inches on each side.

SUMMARY OF THE INVENTION

An integrated circuit package of this invention provides a semiconductor chip package having a large number of package terminals or package leads while maintaining a small package size. Package terminals can be disposed on two or more separate surfaces of the package, such as on the top and bottom surfaces of the package.

Conductive bond finger (inner lead) patterns are formed by photolithographic techniques on one or more layer of a nonconductive material, such as that used for circuit boards. An inner portion of the bond fingers are exposed within a central recess of the housing. These exposed areas of the bond fingers are used for the bonding of a semiconductor die to the bond fingers.

In a preferred embodiment, a housing includes several bi-layer structures, each bi-layer structure consisting of a nonconductive layer and a conductive layer comprising a pattern of conductive leads associated with the nonconductive layer. At least one layer of conductive leads are bond fingers which are substantially enclosed within the laminated package. One or more layer of conductive leads can comprise the package terminals, which are exposed on outer surfaces of the package. Conductive lead layers are separated by one or more nonconductive layers. Preferably, the bond fingers and the package terminals are produced by photolithographic methods. The bi-layer structures are formed, shaped, and laminated together to form a laminated housing. Vias are drilled into the laminated housing, and a conductive material is plated or inserted into the vias to connect the bond fingers and the package terminals, thus providing the medial leads.

Preferably, a first bi-layer structure includes a die attach pad or die attach area, upon which a semiconductor die can be placed. A second bi-layer structure includes a central void which can at least partially enclose a semiconductor die within the void. A third and/or fourth layer of appropriately shaped nonconductive material is present as necessary to separate or enclose the bond finger layers, and to provide desired structural detail to the package. Optionally, a lid is present to provide package closure.

When a semiconductor die is placed within the housing, exposed inner layers of leads are electrically connected to the semiconductor die to provide electrical connections between the enclosed die and, via the media leads, the package terminals. Conveniently, the bond fingers are exposed at the inner void of the package by providing a tiered or stepped structure within the package. The stepped bond fingers of the inner leads are preferably wire-bonded to the semiconductor die. Alternately, one or more inner lead layers can be connected to the semiconductor die using tape automated bonding (TAB) techniques or C4 methodologies. In one embodiment, the semiconductor is connected to one level of bond fingers using TAB methods, while additional connections are made using wire bonding methods.

BRIEF DESCRIPTION OF THE DRAWINGS

FIG. 1c is an exploded view of the device of FIG. 1a.

The Figures are drawn for clarity and are not drawn to scale. Similar numbers refer to similar structures throughout the Figures. The part of the figure drawn toward the upper part of the page is referred to as the "top", and the part of the figure drawn toward the lower part of the page is referred to as the "bottom". This is for convenience of reference only, and actual devices shown can have any desired spatial orientation, including having the "top" portion lowermost.

DISCLOSURE OF THE INVENTION INCLUDING BEST MODE

Figure 1A:
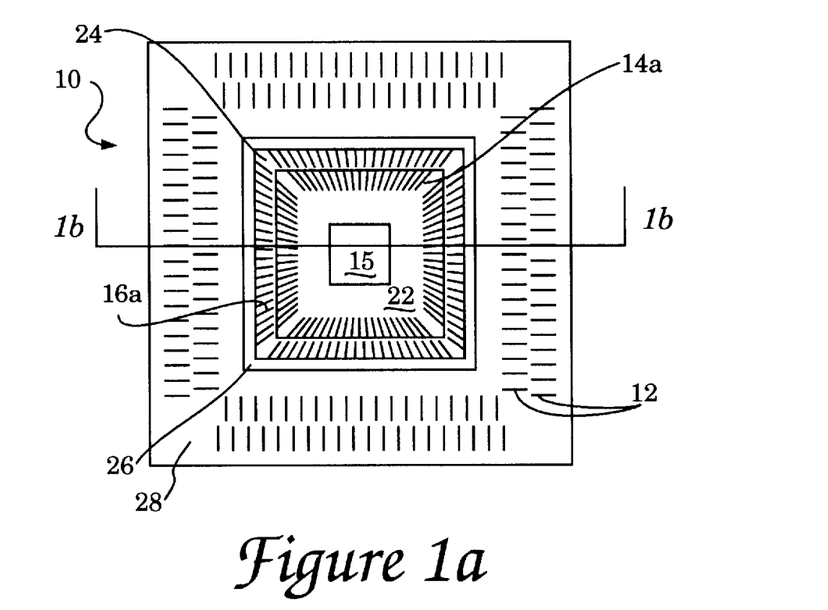
FIG. 1a shows a top view of a semiconductor device package of this invention having staggered package terminals or package leads at the top surface.

FIG. 1a shows a top view of a preferred semiconductor device package 10 of this invention. A first nonconductive layer 22 includes a pattern of first bond fingers 14 and a die attach pad 15. A second nonconductive layer 24 includes a pattern of second bond fingers 16. A third nonconductive layer 26 provides a ledge for the placement of a lid (not shown) if desired. The fourth nonconductive layer 28 includes two staggered rows of package terminals 12.

Figure 1B:
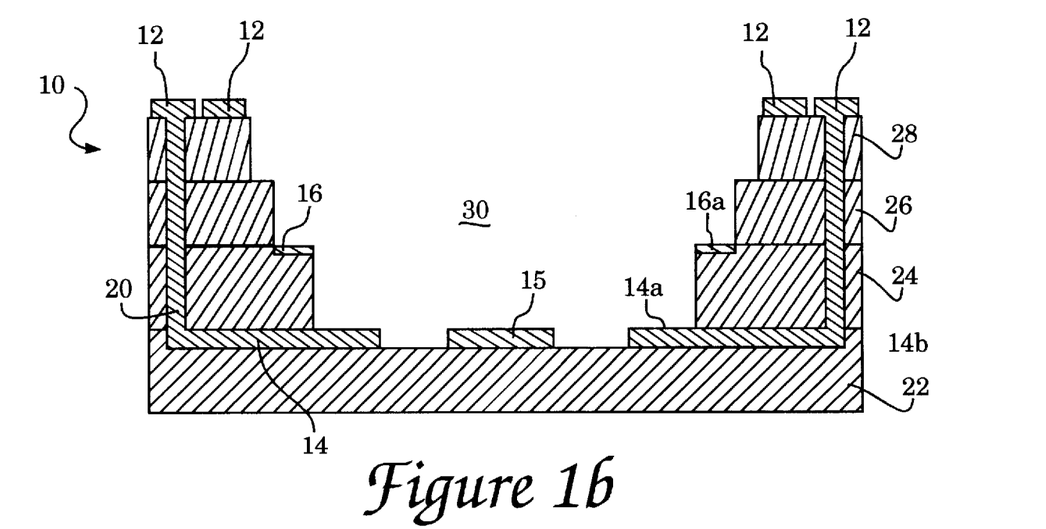
FIG. 1b shows a cross-sectional view of the device of FIG. 1a, taken through line 1b—1b.

FIG. 1b shows a cross-sectional view of the semiconductor device package 10 of FIG. 1a, taken through line 1b—1b. The package 10 is characterized as including two or more patterns of bond fingers 14, 16, each of which leads being connectable at an inner end 14a, 16a to a semiconductor die (not shown). An outer end 14b, 16b (as seen in FIG. 2b) of each inner lead is electrically connected to a medial lead 20. Each medial leads 20 is, in turn, electrically connected to a package terminal 12 on the surface of the semiconductor package 10. Nonconductive material 22, 24, 26, 28 acts to separate the patterns of bond fingers 14, 16 while defining the through-holes or vias which enclose the medial leads 20.

In a preferred embodiment of the invention, inner ends 14a, 16a of the bond fingers 14, 16 are exposed within the central void 30 of the package 10. These exposed areas of the bond fingers are used for bonding of the enclosed semiconductor die (not shown) to the bond fingers 14, 16.

The specific configuration and intended use of the integrated circuit die which will be housed in the laminated package is not critical to the package structure or the general methods for forming the package disclosed herein. Generally, a multiplicity of bonding pads are provided on a surface of the integrated circuit die (not shown) to provide chip input and output (I/O). A generalized pattern of lead fingers can be made and adapted to a variety of semiconductor chips, or a specific lead pattern can be made for a specific chip within a package of this invention.

The bond fingers are preferably formed by known photolithographic techniques on a layer of a nonconductive material, such as that used for circuit boards. Each layer of nonconductive material 22, 24, 26, 28 is a generally planar structure made of a rigid nonconductive or insulative material. A rigid thermoset plastic, such as an epoxy, can be used. Appropriate epoxies include FR-4™ (Westinghouse). Alternatively, a rigid polyimide plastic can be used. Appropriate polyimides include R-4785™ (Matsushida Electric Works, Koriyama, Japan) and those available through Westinghouse (Pittsburgh, Pa.). An especially preferred material is a Bismalemide/Triazine (BT), such as B74 (Westinghouse).

Each layer of nonconductive material 22, 24, 26, 28 can be made of a different material, if desired. However, it is preferable that the individual layers of nonconductive material 22, 24, 26, 28 which are used to form a single housing be of the same material. This provides for consistent thermal expansion characteristics at various temperatures.

The pattern of bond fingers is made of a conductive material, generally a metal. The material or materials used will depend upon the desired conductive attributes, and cost considerations. Copper, gold, nickel, lead, tin, and gold-plated copper leads are especially appropriate. The specific design characteristics of the bond fingers 14, 16 can vary with the integrated circuit die (not shown) and its intended use.

Generally, the bond fingers are formed upon a nonconductive material layer using standard photolithographic techniques. In a preferred embodiment, a substrate of BT is layered with a conducting material by known methods, such as by sputtering, chemical vapor deposition, chemical plating, or the like. Any appropriate patterning process, such as those known to the art, is used to etch the conductive material and produce the pattern of bond fingers on each nonconductive material. Alternatively, the conductive material can be applied in the desired pattern to produce conductive leads.

The use of photolithographic lead patterning allows a very fine pitch and a small center-to-center measurement of adjoining leads. For example, a center-to-center measurement of 0.100 mil or less can be attained. Preferably, the center-to-center measurement is 0.050 mil or less, more preferably 0.010 mil or less.

The multiple layers of nonconductive material and conductive leads are assembled. Each layer of conductive material is separated by one or more layer of non-conductive material. The structure is laminated together using a nonconductive adhesive. Known prepeg adhesives such as HT-11841 (Westinghouse) can be used.

A set of vias, or holes, is drilled into the laminated structure. Each via terminates at an outer end 14b of a bond finger 14 (the outer end of bond finger 16 is not visible), and is electrically connected to a package terminal 12. The vias are generally perpendicular to the plane of the bond fingers. The specific dimensions of each via can vary with the specific embodiment. Generally, however, a bore having a diameter of from more than about 20 mil to less than about 7 mil, more preferably about 10 mil.

A conductive material is placed within a via to form a medial lead 20, which provides an electrical connection between a single bond finger and a single package terminal. For example, a via can be plated with copper. The copper material provides an electrical connection between the bond finger and the package terminal. The material used will depend upon the desired conductive attributes, manufacturing parameters, and cost considerations. Copper, gold, nickel, lead, and tin are especially appropriate.

The package terminal can be formed by photolithographic methods, can be formed from one end of the medial leads when the medial leads are formed, or can be formed by alternate appropriate methods. The package terminals can have any desired dimensions or profile. The package terminals 12 pictured are generally elongated and flattened. However, they can be rounded, triangular, eccentric, oval, or the like, in either cross-section or in profile. Unlike standard semiconductor packages, the package terminals 12 of this invention are located at the top and/or at the bottom of the package 10, connected to the bond fingers 14, 16 by medial leads 20 which are substantially enclosed within the package 10.

Figure 1C:
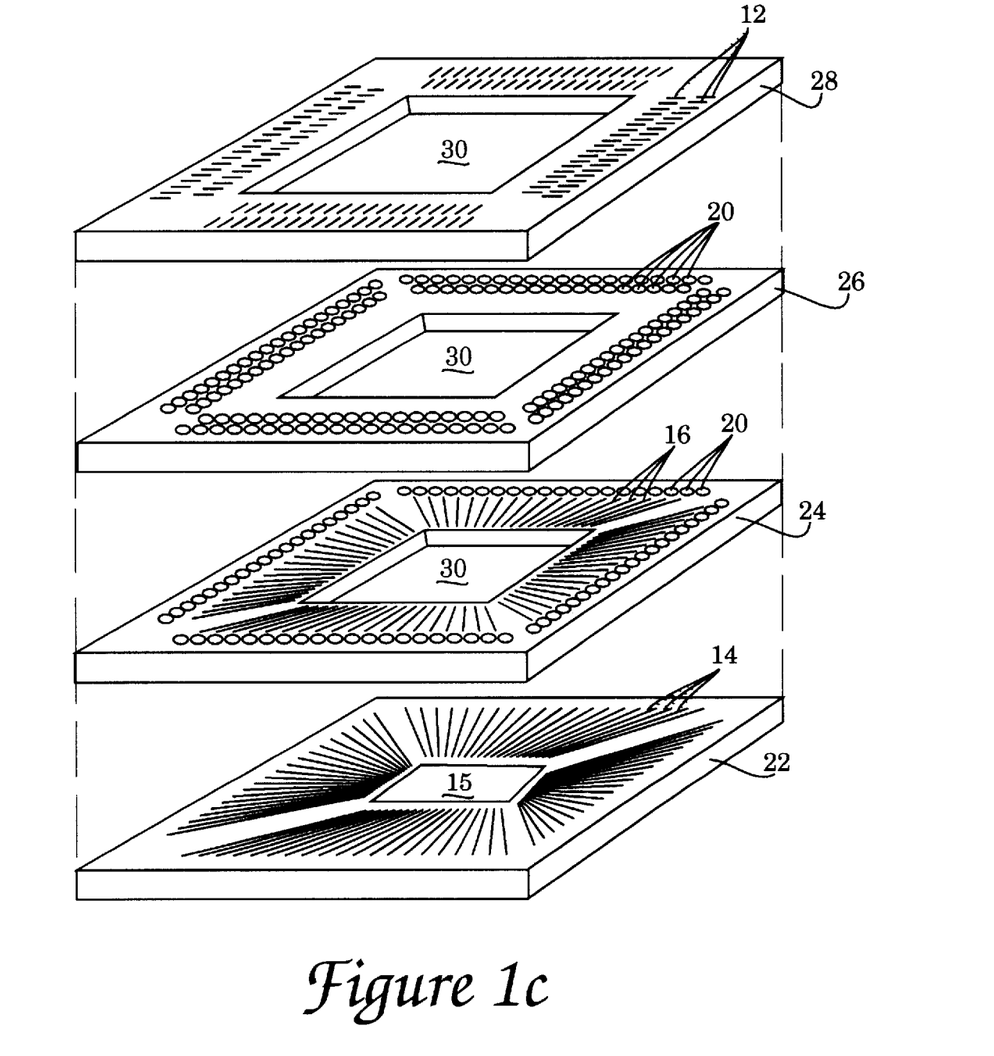

FIG. 1c shows an exploded view of the laminated package 10 shown in FIGS. 1a and 1b.

The package 10 includes a first nonconductive material 22 upon which a pattern of bond fingers 14 has been formed. These bond fingers 14 do not extend to the outer edges of the first nonconductive material 22. A via is drilled to contact package end of the bond finger to the package terminal. These vias are conveniently formed after the package has been laminated, but may be formed when the separate layers are manufactured. A conductive material, such as copper, is used to plate the via and provide the electrical connection between the individual bond fingers and a corresponding package terminal.

Centrally located on the first nonconductive material 22 is a die attach pad 15, upon which an integrated circuit die (not shown) is fixed. The use of a die attach pad, and various adhesive strategies for bonding an integrated circuit die thereto, are well known to the art.

As discussed above, the first nonconductive material 22 is made of a nonconductive material such as that used for circuit boards. In a preferred embodiment, the bond fingers are formed upon the nonconductive material layer using standard photolithographic techniques.

The individual layers of nonconductive material can be individually shaped cut and shaped prior to the addition of the bond finger (inner lead) pattern. However, it is generally more convenient that an array of such layers be processed from one larger board, in a process analogous to the production of individual dies from a silicon wafer. In a process to produce a multiplicity of bi-layer structures including a first nonconductive layer 22 and a first bond finger pattern 14, a sheet of nonconductive material is coated with a metal or other conductive material. A patterning process is used to selectively remove part of the conductive material, leaving a grid of bond finger patterns separated by scribe lines. Alternatively, the conductive material can be applied in a desired pattern. Vias or through-holes can be bored at this time, if desired. If the nonconductive layer includes a central void, the void can be formed by drilling or the like. The sheet of nonconductive material containing an array of first nonconductive layers is then cut into individual pieces to form a plurality of first nonconductive layers 22. The process is repeated using appropriate patterning processes to produce additional nonconductive layers 24, 26, 28.

In a preferred embodiment of the invention areas of the bond fingers 14, 16 are exposed within the central void 30 of the package 10. These exposed areas of the bond fingers are used for bonding of the enclosed semiconductor die (not shown) to the bond fingers 14, 16.

Figure 2A:
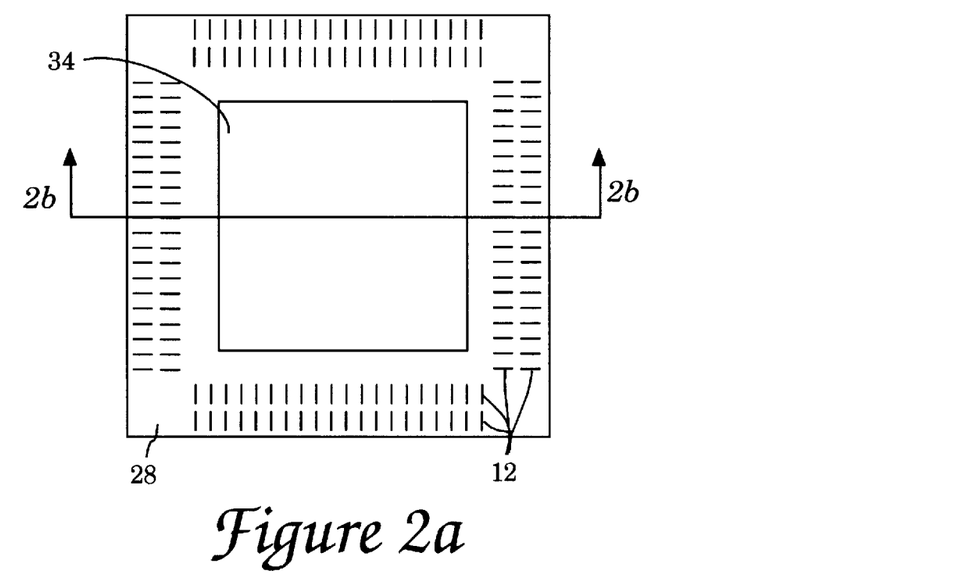
FIG. 2a shows a top view of an alternate semiconductor device package of this invention with a package lid in place.
Figure 2B:
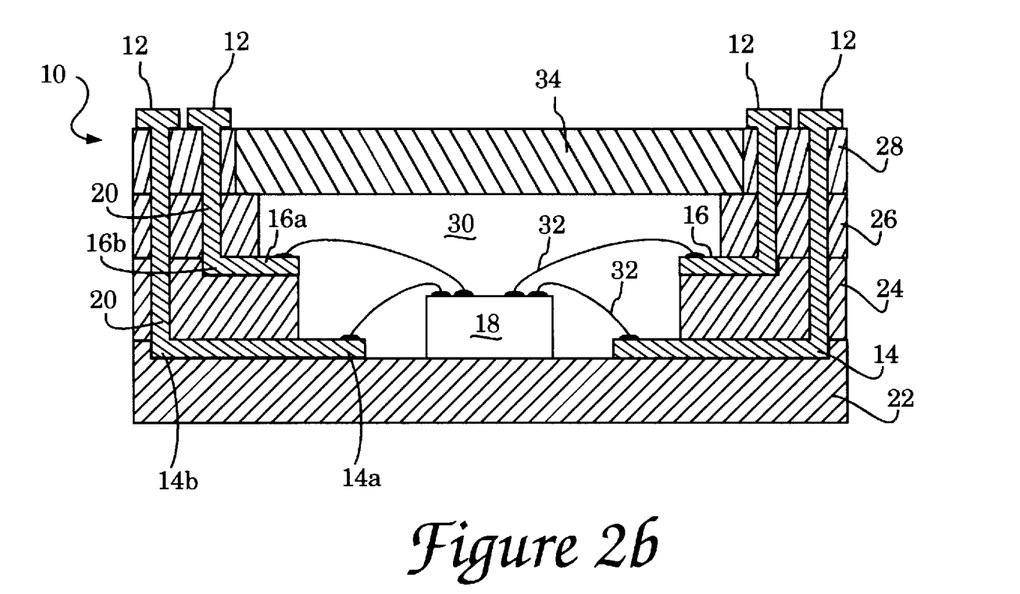
FIG. 2b shows a cross-sectional view of the device of FIG. 2a, taken through line 2b—2b.

FIG. 2a shows a top view of a semiconductor device package 10 of this invention with a package lid or cover 34 in position. The uppermost nonconductive layer 28 includes two aligned rows of package terminals 12.

FIG. 2b shows a cross-sectional view of the semiconductor device package 10 of FIG. 2a, taken through line 2b—2b. In the pictured embodiment, a semiconductor die 18 is wire-bonded to individual leads of each of the first pattern of bond fingers 14 and the second pattern of bond fingers 16. A plurality of thin conductive wires 32 are positioned to provide an electrical connection between circuit inputs or outputs on the integrated circuit die 18 and individual bond fingers 14, 16.

As discussed above, the specific configuration and intended use of the integrated circuit die which is housed in the laminated package is not critical to the package structure or the general methods for forming the package. A multiplicity of bonding pads are provided on one or more surface of the of integrated circuit die 18 to provide chip input and output (I/O). A generalized pattern of leads can be made and adapted to a variety of semiconductor chips, or a specific lead pattern can be made for a specific chip.

The package 10 is characterized as including two or more patterns of bond fingers 14, 16, each of which leads being connectable at an inner end 14a, 16a to a semiconductor die 18. An outer end 14b, 16b of each bond finger is electrically connected to a medial lead 20. Each medial leads 20 is, in turn, electrically connected to a package terminal 12 on the surface of the semiconductor package 10. Nonconductive material 22, 24, 26, 28 acts to separate the patterns of bond fingers 14, 16 while defining the through-holes or vias which enclose the medial leads 20.

When a wire bond assembly is used it is common to include a silicone gel (not shown) to cover and protect the wire bond connections and/or the die surface. The gel acts to encapsulate the leads and provide a stress relief for the leads during assembly. The gel further provides an ionic contamination barrier for the integrated circuit die 18, and protects the die 18 from direct contact by the potting mixture (not shown), if a potting mixture is used. The relatively viscous silicone gel is preferably composed of an ionically pure silicone gel mixture, such as MicroSi9017E (Shin-Etsu). Other suitable gels include HIPEC Q1-4939 (Dow Corning), XS-3183-40A (Amicon) and X3-6700 (Dow Corning).

If desired, a potting mixture (not shown) can be used to fill the central void 30. A potting mixture provides rigidity and protection for the package. The potting mixture is preferably a low viscosity epoxy mixture which can flow readily into the central void 30. A suitable potting mixture is the semiconductor encapsulant ES4438 (Hysol Division, Dexter Corp., Industry, Calif.). A flame retardant potting mixture such as ES4328 (Hysol) can be used. A variety of epoxies known to the art can also be used.

The central void can be filled with one or more gel or potting agent, or it can be left empty. A cover 34 can be used to enclose the central void 30 and provide protection for the enclosed semiconductor chip 18. The cover 34 can be placed on top of the housing (not shown), or seated within the housing (as pictured). Suitable covers 34 are well known to the art and include covers made of ceramic, plastic, epoxy, and the like.

The package terminals can be formed by photolithographic methods, can be formed when the medial leads or formed, or can be formed by alternate appropriate methods. Electrical connections between the package terminals and the environment of use can be provided by known connection methods. For example, solder "bumps" can be positioned at the package terminals 12. A solder reflow process is used to connect the package to the substrate. Alternately, a "bed of nails" grid of contacts can be used. In a preferred embodiment when the environment of use is a circuit board, a socket into which the semiconductor package is placed is attached to the circuit board. Electrical connections between the circuit board and the semiconductor within the package are made by placing the semiconductor package in electrical connection with the socket. This is conveniently done by placing the semiconductor package within an appropriate socket, and latching the socket cover. Terminals on the inner surface of the socket are pressed into contact with the package terminals on the outer surface of the semiconductor package, providing the electrical connections.

Figure 3A:
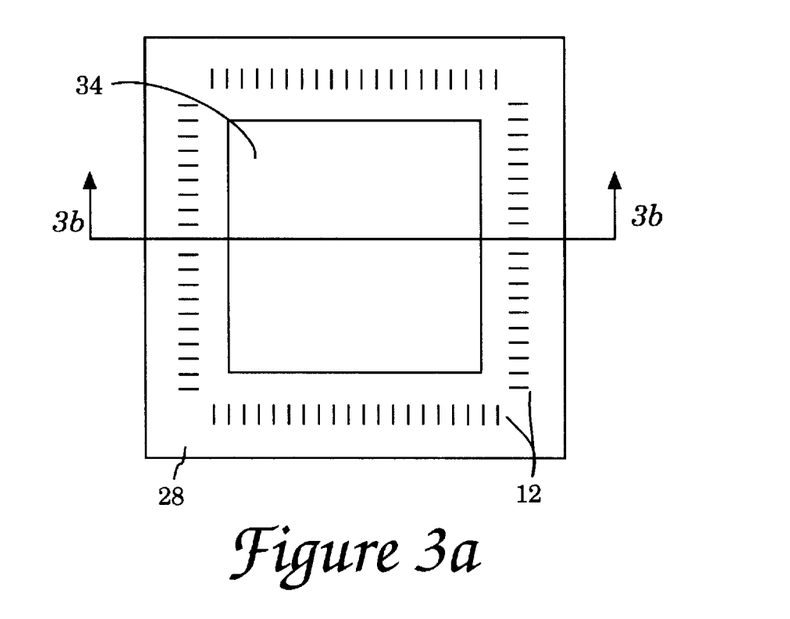
FIG. 3a shows a top view of an alternate semiconductor device package of this invention having both top and bottom leads.

FIG. 3a shows a top view of a semiconductor device package 10 of this invention with a package cover 34 in position. The uppermost nonconductive layer 28 includes a first row of package terminals 12a, while the lowermost nonconductive layer 22 (hidden) includes a second row of package terminals 12b (hidden).

Figure 3B:
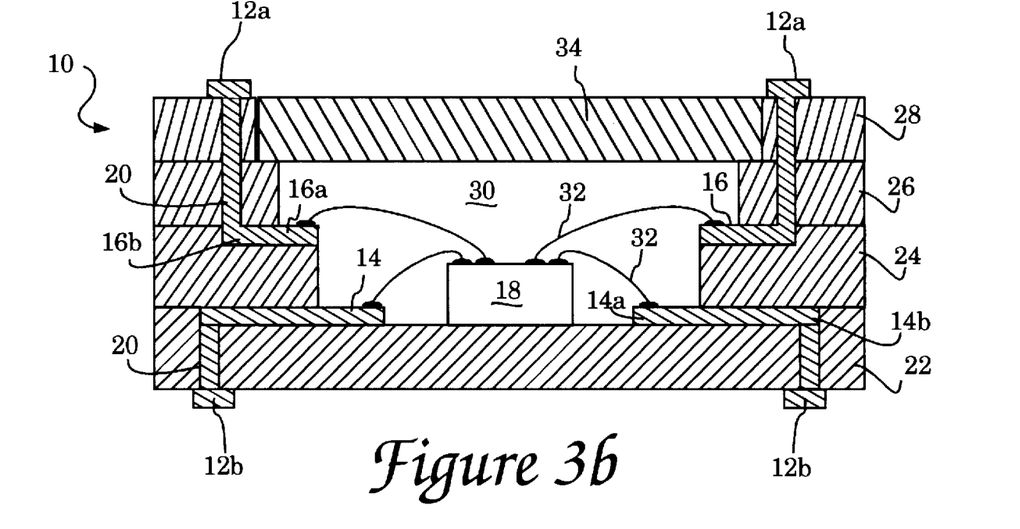
FIG. 3b shows a cross-sectional view of the device of FIG. 3a, taken through line 3b—3b.

FIG. 3b shows a cross-sectional view of the semiconductor device package 10 of FIG. 3a, taken through line 3b—3b. In the pictured embodiment, a semiconductor die 18 is wire-bonded to individual leads of each of the first pattern of bond fingers 14 and the second pattern of bond fingers 16. A plurality of thin conductive wires 32 are positioned to provide an electrical connection between circuit inputs or outputs on the integrated circuit die 18 and individual bond fingers 14, 16.

The two pictured patterns of bond fingers 14, 16, are each connected at an inner end 14a, 16a to a semiconductor die 18. An outer end 14b, 16b of each bond finger is electrically connected to a medial lead 20. Each medial leads 20 is, in turn, electrically connected to a package terminal 12a or 12b on the surface of the semiconductor package 10. In the pictured embodiment, the upper lead layer 16 is connected by medial leads 20 to the upper package terminals 12a, while the lower lead layer 14 is connected by medial leads 20 to the lower package terminals 12b. This is a convenient layout, but is not critical. Nonconductive material 22, 24, 26, 28 acts to separate the patterns of bond fingers 14, 16 while defining the through-holes or vias which enclose the medial leads 20.

The central void can be filled with one or more gel or potting agent, or it can be left empty, as described above. A cover 34 can be used to enclose the central void 30 and provide protection for the enclosed semiconductor chip 18. Suitable covers 34 are well known to the art and include covers made of ceramic, plastic, epoxy, and the like.

Figure 4A:
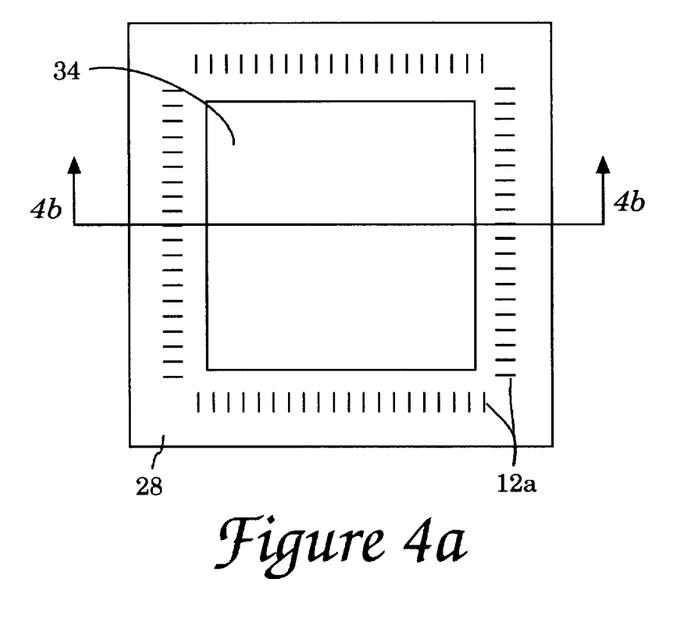
FIG. 4a shows a top view of a TAB bonded semiconductor device package of this invention.

FIG. 4a shows a top view of a semiconductor device package 10 of this invention with a package cover 34 in position. The uppermost nonconductive layer 28 includes a first row of package terminals 12a, while the lowermost nonconductive layer 22 (hidden) includes a second row of package terminals 12b (hidden).

Figure 4B:
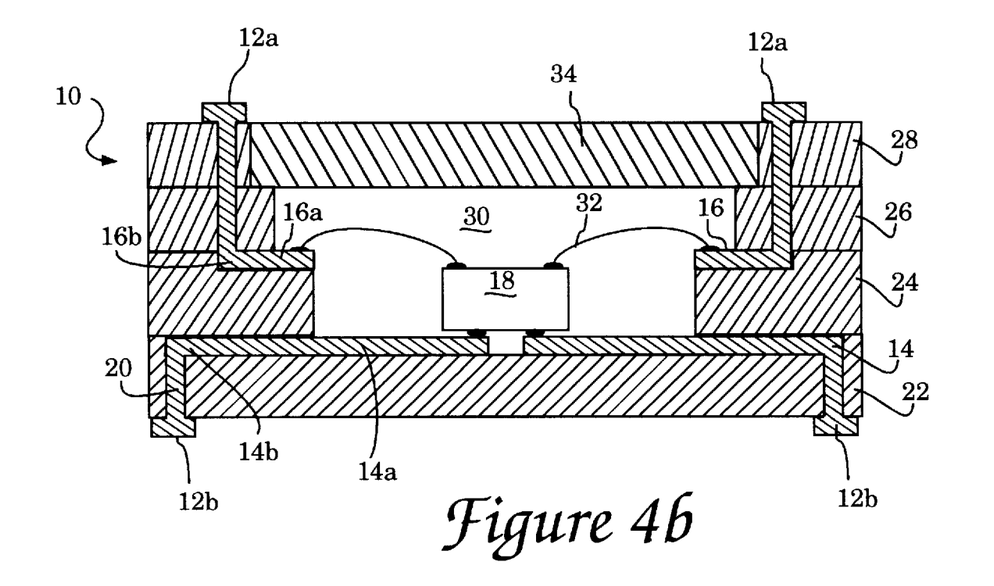
FIG. 4b shows a cross-sectional view of the device of FIG. 4a, taken through line 4b—4b.

FIG. 4b shows a cross-sectional view of the semiconductor device package 10 of FIG. 4a, taken through line 4b—4b. In the pictured embodiment a semiconductor die 18 is TAB bonded to individual lower leads of the first pattern of bond fingers 14, and wire-bonded to individual leads of second pattern of bond fingers 16. Alternatively, the semiconductor die 18 can be C4 bonded to leads of the first or second pattern of bond fingers 14, 16.

When TAB bonding is used, the first pattern of bond fingers 14 does not include a die attach pad. Rather, when the integrated circuit die 18 is electrically and mechanically connected using TAB techniques, a plurality of connective beads 33 are positioned between integrated circuit output locations on the integrated circuit die 18 and the first pattern of bond fingers 14 to provide an electrical connection between the circuits on the die 18 and the package terminals 12b.

In the pictured embodiment, individual leads of second pattern of bond fingers 16 are connected to the integrated circuit die 18 by wire bonding. A plurality of thin conductive wires 32 are positioned to provide an electrical connection between circuit inputs or outputs on the integrated circuit die 18 and individual leads of second pattern of bond fingers 16.

As above, an outer end 14b, 16b of each bond finger is electrically connected to a medial lead 20. Each medial leads 20 is, in turn, electrically connected to a package terminal 12a or 12b on the surface of the semiconductor package 10. In the pictured embodiment, the upper lead layer 16 is connected by medial leads 20 to the upper package terminals 12a, while the lower lead layer 14 is connected by medial leads 20 to the lower package terminals 12b. This is a convenient layout, but is not critical. Nonconductive material 22, 24, 26, 28 acts to separate the patterns of bond fingers 14, 16 while defining the through-holes or vias which enclose the medial leads 20.

The central void can be filled with one or more gel or potting agent, or it can be left empty, as described above. A cover 34 can be used to enclose the central void 30 and provide protection for the enclosed semiconductor chip 18. Suitable covers 34 are well known to the art and include covers made of ceramic, plastic, epoxy, and the like.

While the invention has been described in connection with several exemplary embodiments, it will be understood that many modifications will be apparent to those of ordinary skill in the art in light of the above disclosure. Such modifications may include using TAB bonding to two or more lead layers, heat-sinks at various surfaces of the package, one or more ground plane or power plane manufactured into the package, substitute materials, smaller or greater dimensions, more than one die in a package, a variety of different shapes for conductors, insulators and so forth, to achieve substantially the same results in substantially the same way. Reference to the following claims should be made to determine the scope of the claimed invention.

I claim:

1. A package for containing an integrated circuit die within a central cavity, said package comprising a laminated structure including:

(a) a first nonconductive rigid substrate having a pattern of first conductive bond fingers embedded thereupon, said first conductive bond fingers having one end of said first conductive bond fingers exposed within said central cavity for connection to a semiconductor die;

(b) a second nonconductive rigid substrate positioned above the pattern of first conductive bond fingers of the first nonconductive rigid substrate; said second nonconductive rigid substrate having a pattern of second conductive bond fingers embedded thereupon, said second conductive bond fingers having one end of said second conductive bond fingers exposed within said central cavity for connection to a semiconductor die;

(c) a third nonconductive rigid substrate positioned above the pattern of second conductive bond fingers of the second nonconductive rigid substrate;

(d) a plurality of exposed package terminals positioned on both an upper surface and on a lower surface of the package once assembly of the package is complete; and (e) a plurality of electrically conductive medial leads which are substantially perpendicular to the first conductive bond fingers and the second conductive bond fingers; wherein each of said medial leads electrically connects a first conductive bond finger or a second conductive bond finger to an exposed package terminal.

2. A package of claim 1 wherein an integrated circuit die is electrically connected to individual first conductive bond fingers using tape automated bonding methods and to individual second conductive bond fingers using wire bond methods.

3. A package of claim 1 wherein at least one of the first nonconductive rigid substrate, the second nonconductive rigid substrate, and the third nonconductive rigid substrate is selected from a group consisting of polyimides, BT resins, epoxy resins, and mixtures thereof.

4. The package of claim 1 wherein said first conductive bond fingers are electrically connected to exposed package terminals on said lower surface of said package, and wherein said second conductive bond fingers are electrically connected to exposed package terminals on said upper surface of said package.

5. A package including an integrated circuit die, said package comprising:

(a) an integrated circuit die positioned within a central cavity, said central cavity being defined by a first nonconductive rigid substrate, a second nonconductive rigid substrate, and a third nonconductive rigid substrate;
  (i) a first nonconductive rigid substrate having a pattern of first conductive bond fingers embedded thereupon, said first conductive bond fingers having one end thereof exposed within said central cavity and electrically connected to the semiconductor die;
  (ii) a second nonconductive rigid substrate positioned above the pattern of first conductive bond fingers of the first nonconductive rigid substrate; said second nonconductive rigid substrate having a pattern of second conductive bond fingers embedded thereupon, said second conductive bond fingers having one end thereof exposed within said central cavity and electrically connected to the semiconductor die; and
  (iii) a third nonconductive rigid substrate positioned above the pattern of second conductive bond fingers of the second nonconductive rigid substrate;

(b) a plurality of exposed package terminals positioned on both a lower outer surface of said first nonconductive rigid substrate and on an upper outer surface of said third nonconductive rigid substrate once assembly of the package is complete; and (c) a plurality of medial leads which are substantially perpendicular to the first conductive bond fingers and the second conductive bond fingers; wherein each of said medial leads electrically connects a first conductive bond finger or a second conductive bond finger to an exposed package terminal.

6. The package of claim 5 wherein said first conductive bond fingers are electrically connected to exposed package terminals on said lower surface of said package, and wherein said second conductive bond fingers are electrically connected to exposed package terminals on said upper surface of said package.

7. A package of claim 5 wherein an integrated circuit die is electrically connected to individual first conductive bond fingers using tape automated bonding methods and second conductive bond fingers using wire bond methods.

* * * * *